United States Patent
Chien et al.

(10) Patent No.: US 6,967,346 B2
(45) Date of Patent: Nov. 22, 2005

(54) LIGHT EMITTING DIODE STRUCTURE AND MANUFACTURE METHOD THEREOF

(75) Inventors: Fen-Ren Chien, Yung-Ho (TW); Lung-Chien Chen, Hsin-Chuang (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 157 days.

(21) Appl. No.: 10/633,029

(22) Filed: Aug. 2, 2003

(65) Prior Publication Data
US 2005/0026399 A1 Feb. 3, 2005

(51) Int. Cl.$^7$ .............................................. H01L 29/06

(52) U.S. Cl. ........................ 257/22; 257/14; 257/94

(58) Field of Search .............................. 257/14, 79, 94, 257/103, 22

(56) References Cited

U.S. PATENT DOCUMENTS

| | | | |
|---|---|---|---|
| 6,121,121 A | 9/2000 | Koide | 438/481 |
| 6,229,834 B1 * | 5/2001 | Nisitani et al. | 372/45 |
| 6,835,962 B2 * | 12/2004 | Udagawa | 257/97 |
| 2002/0136932 A1 * | 9/2002 | Yoshida | 428/698 |
| 2004/0026704 A1 * | 2/2004 | Nikolaev et al. | 257/82 |

* cited by examiner

*Primary Examiner*—David Nelms
*Assistant Examiner*—Quoc Hoang

(57) ABSTRACT

A light emitting diode (LED) structure and manufacture method thereof are disclosed, wherein a buffer layer is grown on a substrate and then an LED structural layer is grown on the buffer layer. The LED structural layer comprises a p-type quantum-dot epitaxial layer on a p-type GaN layer. As the p-type quantum-dot epitaxial layer has a coarsening and scattering effect the path of light emitted from an INGaN multiple-quantum-well structural layer is changed. Therefore, it is possible to decrease the probability of total reflection and thereby increase the light-emitting efficiency of LED.

1 Claim, 2 Drawing Sheets

LIGHT EMITTING DIODE STRUCTURE AND MANUFACTURE METHOD THEREOF

BACKGROUND OF THE INVENTION

1. Field of the Invention

The present invention relates to light-emitting diodes (LEDs) structures, and more particularly, to an LED structure containing a p-type quantum-spot epitaxial layer grown on a p-type GaN layer. The present invention also relates to a manufacture method for the LED.

2. The Prior Art

Because the refractive index (n) of gallium nitride (GaN) semiconductor as an LED material is 2.3 approximately, far different from that of air (n=1), a small critical angle of total reflection about 25° exists to block almost all the incident rays emitted from a light-emitting layer of LED.

For improvement, a known method according to IEEE Transactions on Electron Devices, 47(7), 1492, 2000 was presented to coarsen a semiconductor surface, particularly an epitaxy surface to raise the scattering and refracting probability of incident light usually by way of etching. U.S. Pat. No. 5,040,044 discloses a chemical etching process for coarsening a light-emitting element to improve tight emitting efficiency. Besides, there are other similitudes, such as U.S. Pat. Nos. 5,429,954 and 5,898,192. However, the mentioned processing method is applicable only to the red-light LED, not to GaN-based materials which are especially weak in resistance against acids/alkalis, and it is relatively difficult to control a wet etching process while a dry etching process is liable to spoil the epitaxial layer and cause an increment of impedance, particularly in the case of a P-type GaN layer, to thereby affect the current distribution and degrade the light-emitting efficiency. In addition, because the deposited p-type GaN layer is extremely thin (only 0.1–0.3 μm), the light-emitting layer could be impaired occasionally by a direct coarsening to result in a smaller light-emitting area. For promoting permeability, the transparent electrode on a GaN LED should be made as thinner as possible (about 10 nm) so that a direct coarsening job might destroy the transparent thin electrode or make it discrete to badly affect the current distribution and light-emitting efficiency. On the other hand, though the dry etching process is applicable to a p-type GaN layer having a sufficient thickness, the current distribution and light-emitting efficiency is nevertheless deteriorated to hence set the coarsening process in a dilemma.

SUMMARY OF THE INVENTION

In view of the foregoing problems, the present invention is aimed to coarsen the surface of GaN layer of a light-emitting element by way of growing an epitaxial layer for enhancing light-emitting efficiency significantly.

Therefore, a primary object of the present invention is to grow a p-type quantum-dot epitaxial layer on a p-type GaN layer to simplify the prior coarsening process of a conventional LED.

Another object of the present invention is to change the path of light emitted from an INGaN multiple-quantum-well structural layer by availing the scattering effect of a coarsened p-type quantum-dot epitaxial layer to hence decrease the probability of total reflection and increase the light-emitting efficiency.

For more detailed information regarding advantages or features of the present invention, at least an example of preferred embodiment will be described below with reference to the annexed drawings.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

Figure 1:
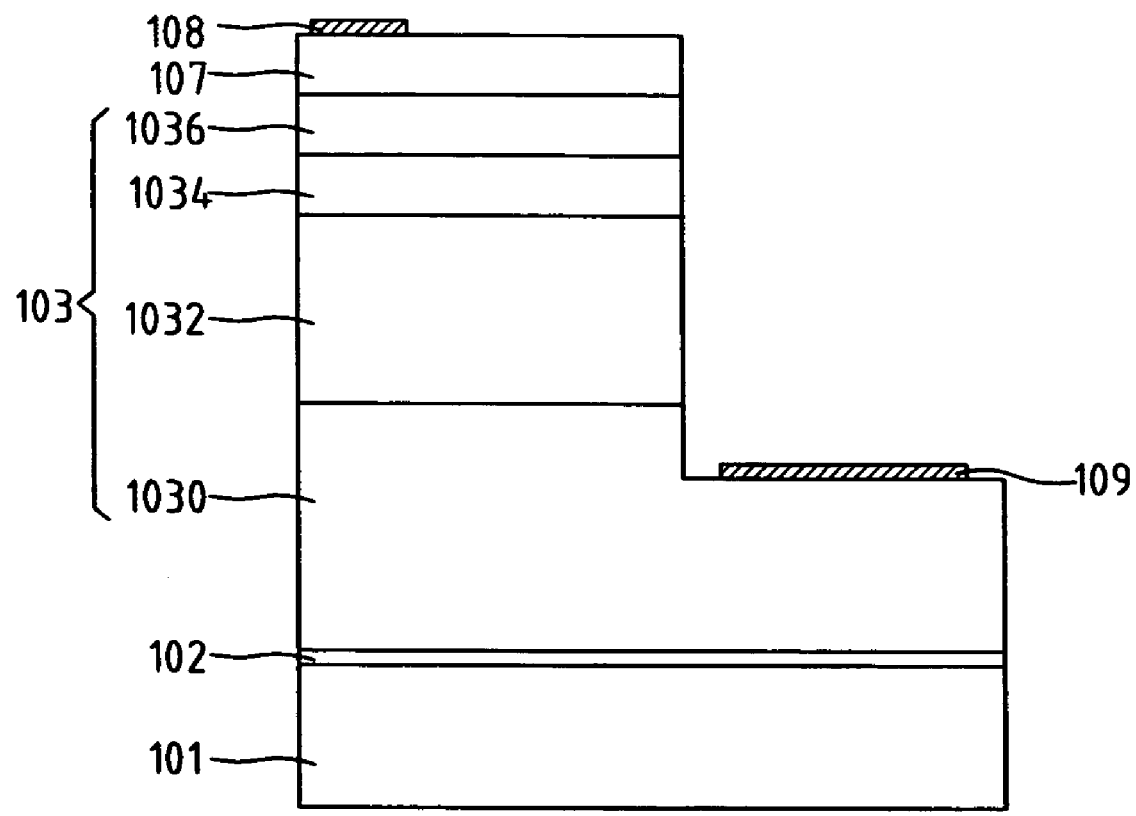
FIG. 1 is a schematic view showing the structure of LED according to an embodiment of the present invention.

FIG. 1 is a schematic view showing the structure of LED according to an embodiment of the present invention. A sapphire substrate 101, which is made of SiC, Si, GaAs, $LiAlO_2$, $LiGaO_2$, or AlN, is put in a MOCVD (Metal Organic Chemical Vapor Deposition) system.

A GaN buffer layer 102 of 20–50 nm thick is formed firstly on the substrate 101 in 500–600° C. vapor, then an LED structural layer 103 on the buffer layer 102. The LED structural layer 103 comprises an n-type GaN layer 1030, a multiple-quantum-well structural layer 1032, a p-type GaAlN layer 1034, and a p-type GaN layer 1036, in which the n-type GaN layer 1030 grown on the buffer layer 102 is a GaN-based compound of group III-V.

The n-type GaN layer 1030 is a 1–2 μm thick Si-impurity-doped layer made in GaN-based compound semiconductor and grown by raising temperature of the substrate to 1000–1200° C. The test piece is then drawn out and dipped in the MOCVD system and the substrate 101 is heated to 700–900° C. to form the multiple-quantum-well structural layer (InGaN) 1032 as a light-emitting layer, which is overlapped by the p-type GaAlN layer (Mg-doped) 1034, the p-type GaN layer (Mg-doped) 1036, and a final Mg-doped p-type quantum-dot epitaxial layer 107 which is made of an InAlN compound. The p-type quantum-dot epitaxial layer 107 is substantially a 10Å-degree coarse-grained $Al_xGa_{(1-x-y)}In_yN$ thin film, where $0 \leq x$, $y<1$, $0 \leq x+y<1$. By means of the foregoing process, an LED epitaxial chip is completed.

The epitaxial chip then undergoes an ICP-RIE (inductively coupled plasma-reactive ion etching) dry etching process for removing part of the p-type quantum-dot epitaxial layer 107, p-type GaN layer 1036, p-type GaAlN layer 1034, and InGaN multiple-quantum-well structural layer 1032 in order to expose the surface of the n-type GaN layer 1030. Then, Ni/AuBe is laid on the surface of the p-type quantum-dot epitaxial layer 107 and electrically connected therewith to serve for a p-type ohmic contact electrode 108, while Ti/Pt/Al/Au is laid on the surface of the n-type GaN layer 1030 and electrically connected therewith to serve for an n-type ohmic contact electrode 109 to thereby form a grain structure to which a forward bias may be applied.

Figure 2:
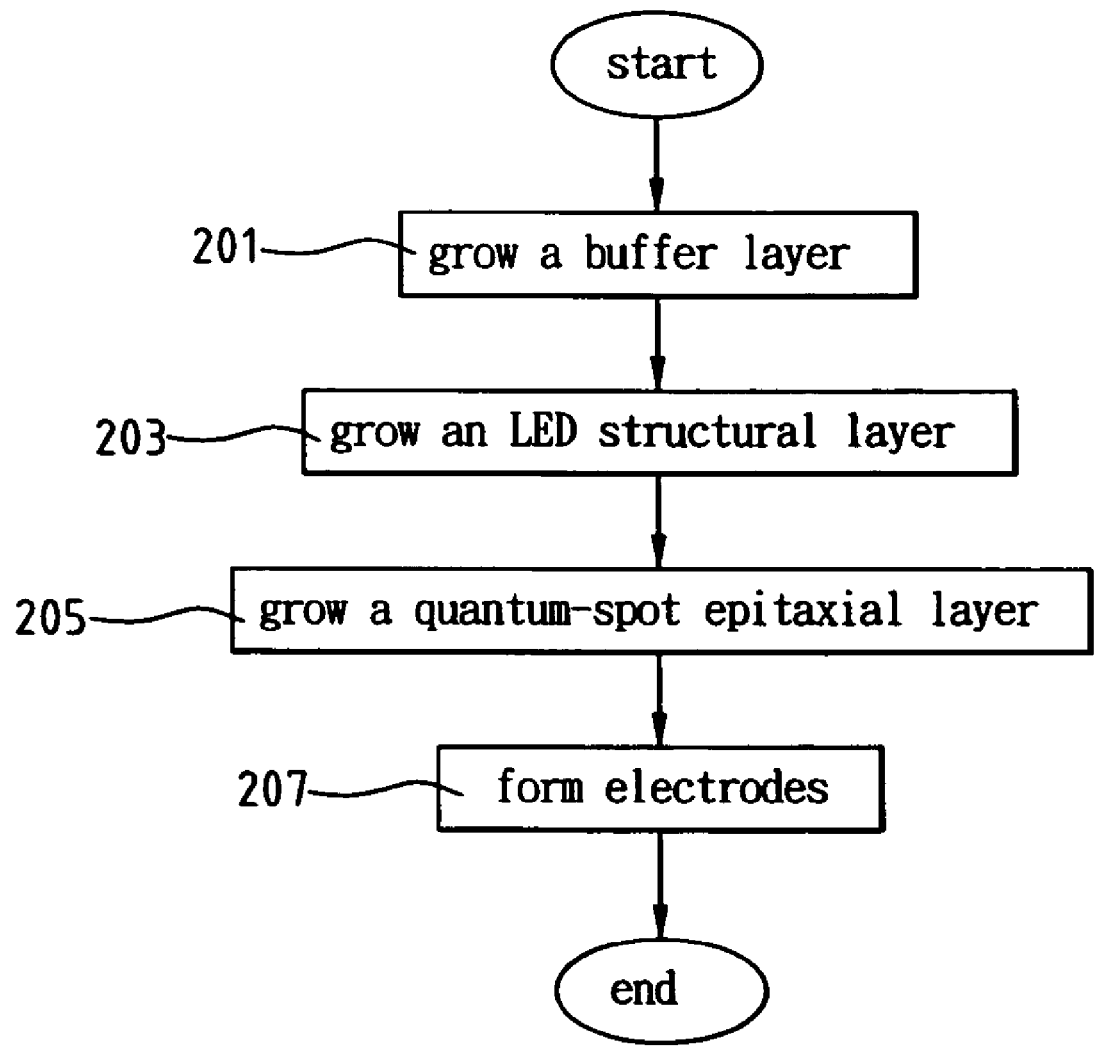
FIG. 2 shows a manufacture flowchart of LED according to the embodiment of the present invention.

FIG. 2 shows a manufacture flowchart of LED according to the embodiment of the present invention. As shown in FIG. 2, a manufacture method of LED of the present invention comprises a step 210 for growing a buffer layer, a step 203 for growing an LED structural layer 103, a step 205 for growing a quantum-dot epitaxial layer 107, and a step 207 for forming an electrode 108/109.

In step 201, a sapphire substrate 101 is immersed in a MOCVD system and heated to 500–600° C. to form a GaN buffer layer 102 of 20–50 nm thick. In step 203, the substrate 101 is heated to 1000–1200° C. to form a Si-impurity-doped n-type GaN layer 1030 of 1–2 μm thick, and then, the test piece is taken out and masked in stripes on its surface by a photolithography process, then etched by a dry etching process in order to obtain a grid pattern. The grid-pattern attached test piece is immersed in the MOCVD again and heated to 700–900° C. at this time to grow an InGaN multiple-quantum-well structural layer 1032 for serving as a light-emitting layer, on which there comes an Mg-doped p-type GaAlN layer 1034, and an Mg-doped p-type GaN layer 1036 follows. In step 205, an Mg-doped p-type quantum-dot epitaxial layer 107 is grown on the p-type GaN layer 1036 to complete an LED epitaxial chip.

Finally, in step 207, the LED epitaxial chip is supposed to undergo an ICP-RIE (inductively coupled plasma-reactive ion etching) dry etching process for removing part of the p-type quantum-dot epitaxial layer 107, p-type GaN layer 1036, p-type GaAlN layer 1034, and InGaN multiple-quantum-well structural layer 1032 so as to expose the surface of the n-type GaN layer 1030. Then, Ni/AuBe is laid on the surface of the p-type quantum-dot epitaxial layer 107 and electrically connected therewith to serve for a p-type ohmic contact electrode 108, while Ti/Pt/Al/Au is formed on the surface of the n-type GaN layer 1030 and electrically connected therewith to serve for an n-type ohmic contact electrode 109 to thereby form a grain structure to which a forward bias may be applied as mentioned above.

In the above described, a preferred embodiment has been described in detail with reference to the drawings annexed, and it is apparent that numerous changes or modifications may be made without departing from the true spirit and scope thereof, as set forth in the claims below.

What is claimed is:

1. A light emitting diode (LED) comprising:

a buffer layer made of a GaN-based compound semiconductor, being grown on a substrate;

an LED structural layer formed on the buffer layer, the LED structural layer further comprising an n-type GaN layer, a multiple-quantum-well structural layer, a p-type GaAlN layer, and a p-type GaN layer, in which the n-type GaN layer is made of a GaN-based compound semiconductor and formed on the buffer layer, the multiple-quantum-well structural layer being made of an InGaN serial compound and situated on the n-type GaN layer, the p-type GaAlN layer being made of a p-type GaAlN-based compound semiconductor and grown on the multiple-quantum-well structural layer, the p-type GaN layer being made of a p-type GaN-based III-V compound semiconductor and grown on the p-type GaAlN layer;

a p-type quantum-dot epitaxial layer made of an InAlN compound, being grown on the p-type GaN layer of the LED structural layer, and part of the n-type GaN layer, the multiple-quantum-well structural layer, the p-type GaAlN layer, the p-type GaN layer, and the p-type quantum-dot epitaxial layer being removed by a single etching process;

a p-type ohmic contact electrode made of Ni/AuBe material being formed on the p-type quantum-dot epitaxial layer and electrically connected therewith; and an n-type ohmic contact electrode being grown on the n-type GaN layer of the LED structural layer and electrically connected therewith;

whereby a forward bias can be applied to the LED.

* * * * *